(12) United States Patent
Hwang et al.

(10) Patent No.: US 10,418,780 B1
(45) Date of Patent: Sep. 17, 2019

(54) DOT PROJECTOR WITH AUTOMATIC POWER CONTROL

(71) Applicant: ARIMA LASERS CORP., Taoyuan (TW)

(72) Inventors: Jung-Min Hwang, Taoyuan (TW); Chia-Hung Hsieh, Taoyuan (TW); Chun-Ting Lin, Taoyuan (TW); Ming-Cho Wu, Taoyuan (TW); Ming-Hui Fang, Taoyuan (TW)

(73) Assignee: Arima Lasers Corp., Taoyuan (TW)

( * ) Notice: Subject to any disclaimer, the term of this patent is extended or adjusted under 35 U.S.C. 154(b) by 0 days.

(21) Appl. No.: 16/039,614

(22) Filed: Jul. 19, 2018

(51) Int. Cl.
*H01S 5/02* (2006.01)
*H01S 5/068* (2006.01)
*H01S 5/022* (2006.01)

(52) U.S. Cl.
CPC ...... *H01S 5/06808* (2013.01); *H01S 5/02212* (2013.01); *H01S 5/02288* (2013.01); *H01S 5/02292* (2013.01); *H01S 5/02296* (2013.01)

(58) Field of Classification Search
CPC ............ H01S 5/02212; H01S 5/02296; H01S 5/02292
See application file for complete search history.

(56) References Cited

U.S. PATENT DOCUMENTS 9,645,408 B2 * 5/2017 Chern .................... G02B 27/48

\* cited by examiner

*Primary Examiner* — Michael Carter
(74) *Attorney, Agent, or Firm* — Rosenberg, Klein & Lee

(57) ABSTRACT

A dot projector with automatic power control includes a housing covering a substrate with an installing space and a platform therein, an automatic power control integrated circuit, a photodiode and a reflector disposed under the platform of the housing, a collimator disposed in the installing space of the housing and a diffractive optical element bonded on the platform of the housing. Whereby a laser diode emits a laser light to the reflector for the laser light to be reflected perpendicularly through the collimator to the diffractive optical element; then the diffractive optical element produces a plurality of light spots and the a stray light is also produced from the laser light. The photodiode of the automatic power control integrated circuit then detects the stray light and produces a feedback signal transmitted back to the laser diode for adjustment of the laser emission power in order to control the light spots produced by the diffractive optical element.

19 Claims, 10 Drawing Sheets

DOT PROJECTOR WITH AUTOMATIC POWER CONTROL

BACKGROUND OF THE INVENTION

1. Field of the Invention

The invention relates to a dot projector, particularly to one that has a feedback signal of stray light transmitted back for a photodiode of an automatic power control integrated circuit to detect and thereby adjust power of a laser light emitted by a laser diode to control light spots produced by a diffractive optical element of the emitter.

2. Description of the Related Art

The luminous intensity of laser diodes can be affected by the amount of driving currents and temperature. The higher the driving currents are, the greater the luminous intensity is, and the higher the temperature is, the greater the optical attenuation is. Also, when a laser diode is activated, even minor changes of voltages can lead to a dramatic change of the electric currents. Therefore, automatic power control is necessary for laser diodes to hold control of the laser lights emitted. FIG. 1 is a laser diode module 10 disclosed in U.S. Pat. No. 7,177,333. The laser diode module 10 includes a heat sink 11 having a recessed hole 111 with a first pin 12a, a second pin 12b and a third pin (not shown) on a back of the heat sink 11, a mount 13 disposed on the heat sink 11 and connected to the second pin 12b as a ground pin, a submount 131 arranged at an inner side of the mount 13 for bonding with a laser diode 14, a photo diode 15 disposed on the heat sink 11, a metal cap 17 having a glass window 171 at a top thereof, an automatic power control (APC) circuit 16 manufactured as a printed circuit board or an integrated circuit to be packaged inside the metal cap 17. The laser diode 14, the photo diode 15 and the first, second and third pins 12a, 12b, (not shown) are connected by wires to form a voltage driving element of the device. However, such device has a huge volume and cannot be integrated in applications; on the other hand, such technology cannot be applied to surface mount technology either.

Current 3D detection techniques mainly have structure light for application. FIG. 2 is an optical pattern projector 20 disclosed in U.S. Pat. No. 8,829,406. The optical pattern projector 20 includes a radiation source assembly 21 mounted on a base 22, a package 23, a collimating lens 24, a diffractive optical element (DOE) 25 and a connector 26.

The radiation source assembly 21 has a laser diode 211 and a photo diode 212; the laser diode 211 emits a laser beam $L_1$ and the photo diode 212 detects a reflected beam $N_1$. The laser diode 211 is mounted on a submount 213 which is fixed on a package stem 214; the package stem 214 is disposed within a can 215 that includes a first window 216. The package 23 has the radiation source assembly 21 packaged therein and further has a second window 231. The collimating lens 24 and the DOE 25 are disposed within the package 23 as well. The connector 26 is coupled to the radiation source assembly 21.

The dot projector 20 has the laser beam $L_1$ emitted through the collimating lens 24 and the DOE 25 to project light dots onto an object; then an image is retrieved by a camera to farther retrieve its 3D data. However, such device has a huge volume and complicated assembly structure, and the radiation source assembly 21 cannot be applied to surface mount technology either, making it impossible for automatic manufacturing process.

In short, neither the laser diode module 10 nor the dot projector 20 can be applied to surface mount technology to be manufactured in automatic manufacturing process. Also, the laser diode 10 has to integrate the heat sink 11, the mount 13, the submount 131, the laser diode 14, the photo diode 15, the APC circuit 16, the metal cap 17 and the first, second and third pins 12a, 12b, (not shown), making it a huge volume for assembly. Even if replacing the radiation source assembly 21 of the dot projector 20 by the laser diode module 10, the problems of huge volume and complicated structure are still exiting, or the problems could be worse. Therefore, the inventor has invented a dot projector with automatic power control to overcome the problems stated above.

SUMMARY OF THE INVENTION

It is a primary objective of the present invention to provide a dot projector with automatic power control that has a substrate integrating an automatic power control integrated circuit (IC), a mounting seat, a laser diode, a reflector, a housing, a collimator and a diffractive optical element (DOE) to improve the complex structure with greater volume of a conventional device that cannot be applied to surface mount technology.

It is another objective of the present invention to provide a dot projector with automatic power control that has a laser diode including an automatic power control IC on a photodiode and a reflector to produce a controllable laser light that adjusts light spots of a DOE by a feedback signal.

Yet another objective of the present invention is to provide a dot projector with automatic power control that has an automatic power control IC controlling a feedback signal and temperature compensation to stabilize emission of a laser light and including a protection circuit to keep a stable output of the light spots.

In order to achieve the above objects, the dot projector with automatic power control includes a substrate; an automatic power control integrated circuit mounted on said substrate and including a photodiode; a mounting seat mounted on said substrate; a laser diode mounted on said mounting seat and coupled to said automatic power control integrated circuit; a reflector mounted at a front of said laser diode; a housing having an installing space and a platform and covering on said substrate for said automatic power control integrated circuit, said laser diode and said reflector to be covered within said installing space of said housing; a collimator disposed in said installing space of said housing above said automatic power control integrated circuit, said laser diode and said reflector; and a diffractive optical element adhered on said platform of said housing for said diffractive optical element to be above said collimator; whereby the laser diode emits a laser light to the reflector and the laser light is reflected perpendicularly through the collimator to the diffractive optical element, the diffractive optical element thereby producing a plurality of light spots and the laser light producing a stray light by the reflection; the photodiode of the automatic power control integrated circuit then detects the stray light and sends a feedback signal to the laser diode for the laser diode to adjust emission power of the laser light and further control the light spots from the diffractive optical element.

Moreover, the automatic power control integrated circuit includes a voltage input pin, a ground pin, a current setting pin, a photodiode output pin and a laser diode output pin.

A structure of the automatic power control integrated circuit further includes having the voltage input pin series connected to the photodiode and parallel connected to a resistor and a first electrostatic discharge circuit, said first electrostatic discharge circuit further parallel connected to a ground pin, a logic circuit separately connected to the resistor and the current setting pin in series connection, a current amplifier series connected to the photodiode, an error amplifier parallel connected to the current amplifier, a protection circuit parallel connected to the error amplifier and including a voltage reference unit, an overheat protection unit and an undervoltage-lockout unit, a transistor separately connected to the error amplifier, the laser diode output pin and the ground pin in series connection, a current monitoring circuit parallel connected to the ground pin, a second electrostatic discharge circuit separately connected to the current setting pin and the ground pin in parallel connection, a third electrostatic discharge circuit separately connected to the current setting pin and, the ground pin in parallel connection and a variable resistor separately connected to the photodiode output pin and the ground pin in series connection, said laser diode separately connected to said voltage input pin and said laser diode output pin in series connection. The automatic power control integrated circuit further includes a soft start circuit for preventing overcurrent during activation of the dot projector.

Furthermore, the current monitoring circuit is set for a current value of 100 mA when the logic circuit distinguishes the current setting pin is logical high, and the current monitoring circuit is set for a current value of 300 mA when the logic circuit distinguishes the current setting pin is logical low. The voltage reference unit is set for a voltage value of 0.55V when the logic circuit distinguishes the current setting pin is logical high, and the voltage reference unit is set for a voltage value of 1.1V when the logic circuit distinguishes the current setting pin is logical low; the overheat protection unit is set for a temperature higher than 165° and less than 135°; and the undervoltage-lockout unit is set for a voltage value less than 2.3V and greater than 2.5V.

The variable resistor is set for a value ranging 35 Kohm-1 Kohm; when the photodiode is set for a current value of 90 µA, the variable resistor is set for a value of 6 Kohm correspondingly. A value of a human body model of the first, second and third electrostatic discharge circuits is set greater or equal to 2 KV and a machine model of the first, second and third electrostatic discharge circuits is set greater or equal to 200V.

In addition, the substrate includes a first surface with a first conductive pad and, a second surface with a second conductive pad, said first and second surfaces are arranged at opposite sides correspondingly, and the substrate is made of a printed circuit board for an internal wire to be coupled with the first and second conductive pads, said first conductive pad connected to said automatic power control integrated circuit and said laser diode with a plurality of external wires and said second conductive pad connected to an external circuit. The collimator is either a single lens or an array of microlenses. The housing is made of copper, stainless steel or aluminum. And the first surface of the substrate has a metal frame framing the automatic power control integrated circuit, the mounting seat and the reflector, and the metal frame has a bonding layer thereon bonded with a bottom surface of the housing.

The metal frame is made of either nickel gold or nickel palladium gold. The bonding layer is made of either adhesives or metal; the adhesives is either silicone or epoxy and the metal is selected from a group consisting of gold-tin, copper-silver, tin-silver-copper and indium.

Still, the installing space of the housing further has a fixing structure therein, including an outer ring and an inner ring, said outer ring having an outer periphery thereof fixedly abutting the installing space for the collimator to be disposed therein and including a central hole corresponding to a central protrusion of the collimator and aligning with the reflector perpendicularly, said inner ring having an inner periphery thereof mounted on the central protrusion of the collimator and a bottom surface thereof abutting on a flat surface of the collimator. The platform of the housing is arranged within the housing to form a rabbet.

In short, the substrate integrates the automatic power control IC of the photodiode, the mounting seat, the laser diode, the reflector, the housing, the collimator and the DOE within the emitter device, and the laser diode, the automatic power control IC and the reflector forms a feedback control structure of the laser light which is further stably emitted by the control and temperature compensation of the automatic power control IC. The present invention therefore has features of simple integration, light volume, low prime costs and stable output of the laser light and the laser light spots.

DETAILED DESCRIPTION OF THE PREFERRED EMBODIMENT

Figure 1:
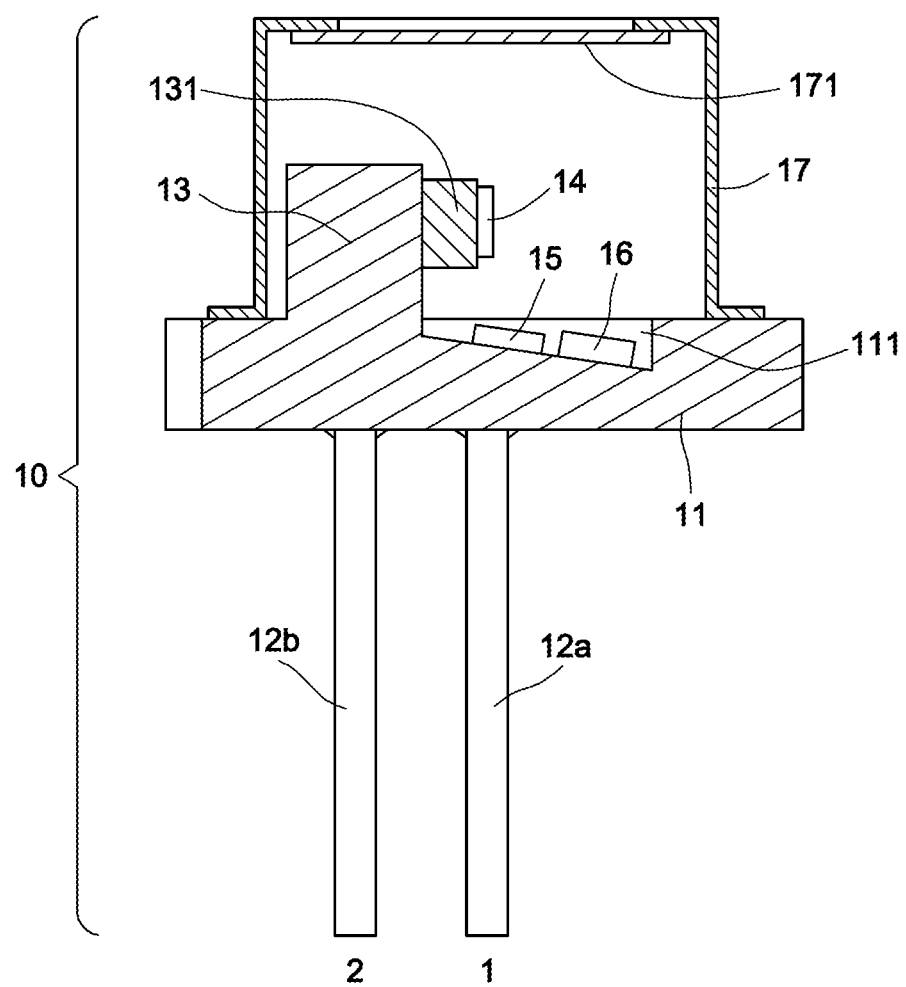
FIG. 1 is a schematic diagram of a conventional laser diode module.
Figure 2:
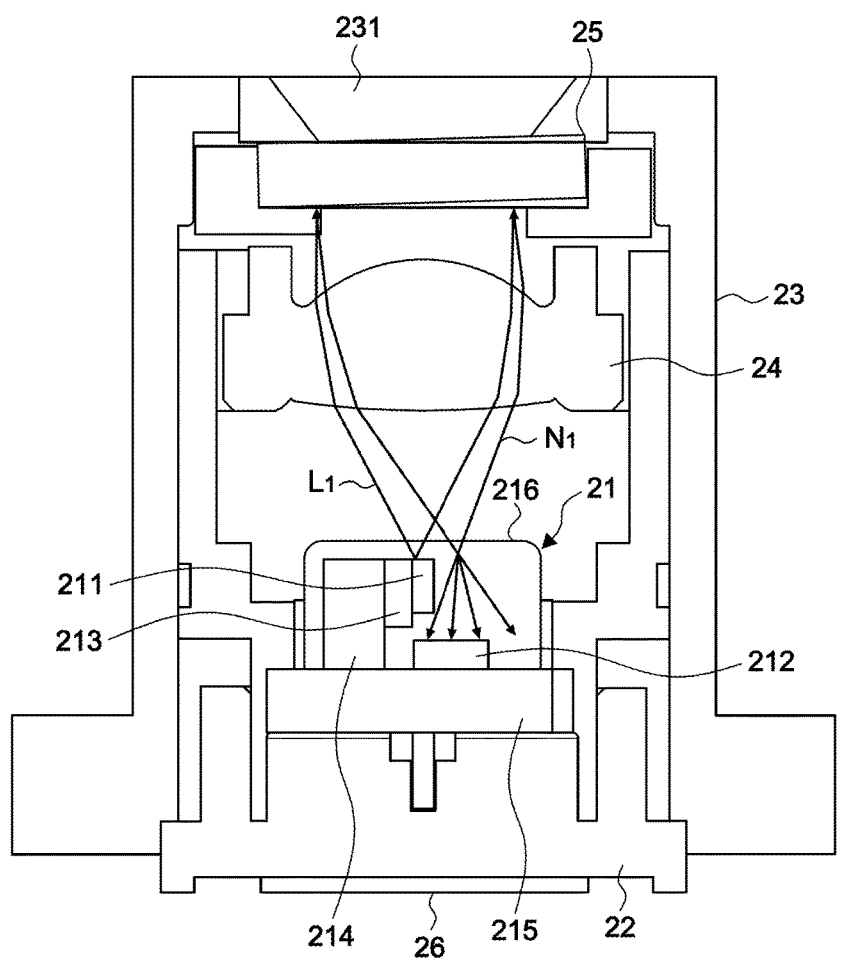
FIG. 2 is a schematic diagram of a conventional optical pattern projector.
Figure 3A:
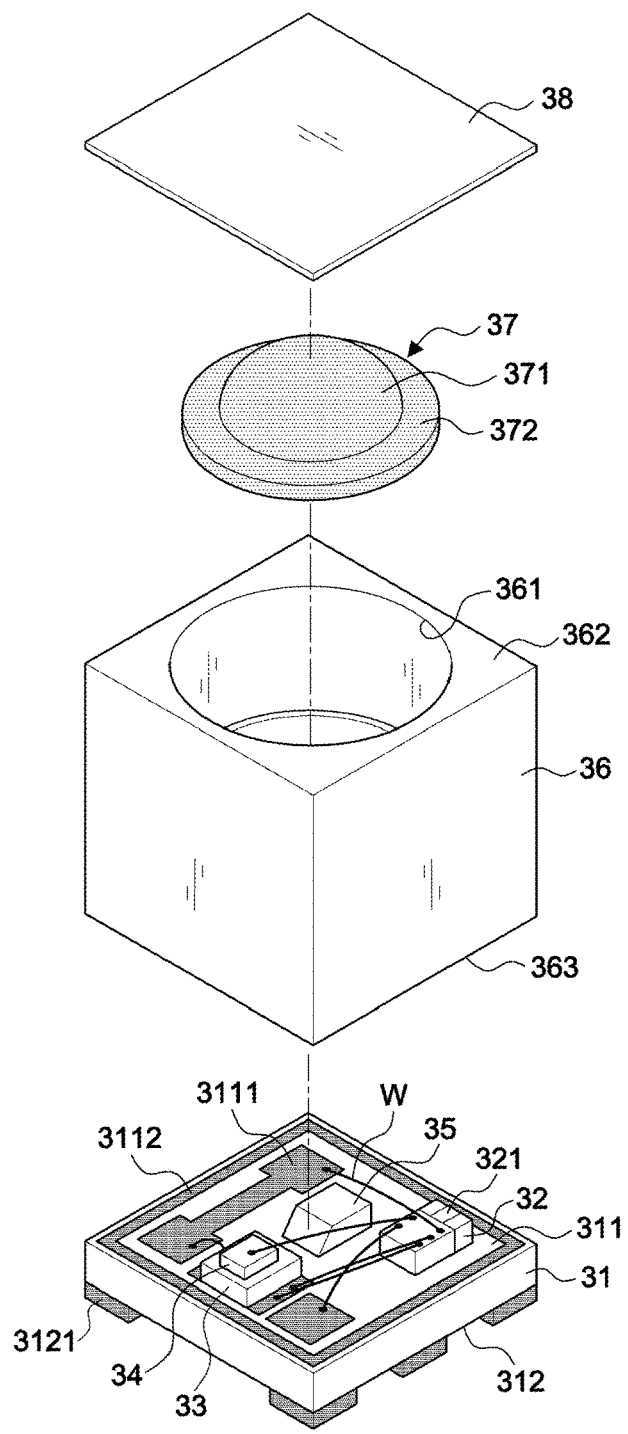
FIG. 3A is an exploded view of the present invention.
Figure 3B:
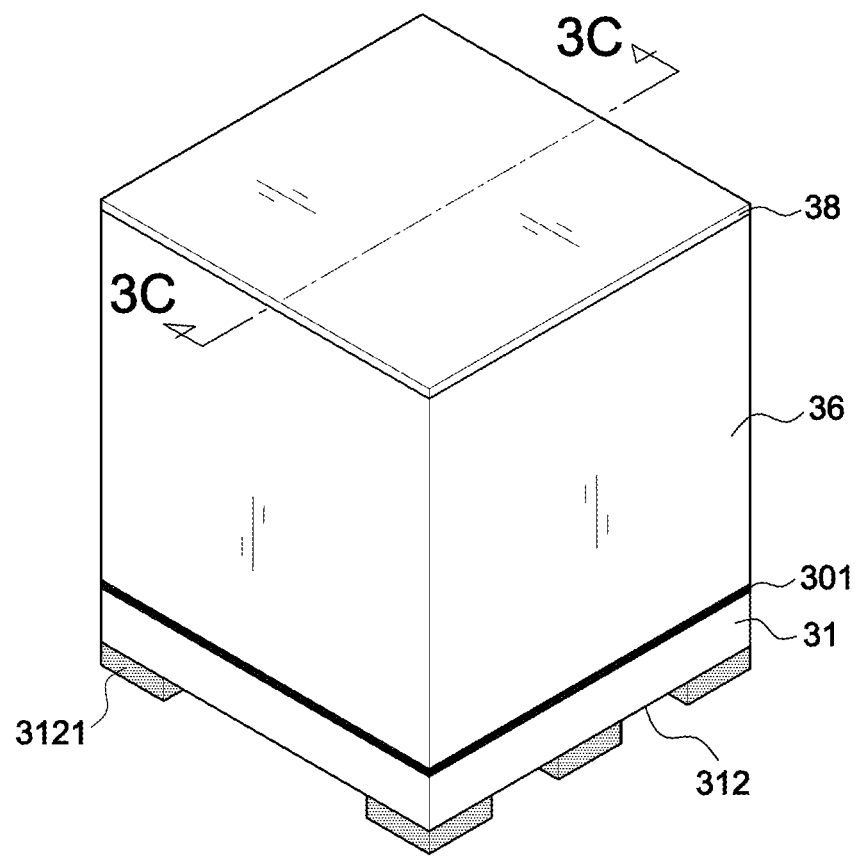
FIG. 3B is a perspective view of the present invention.
Figure 3C:
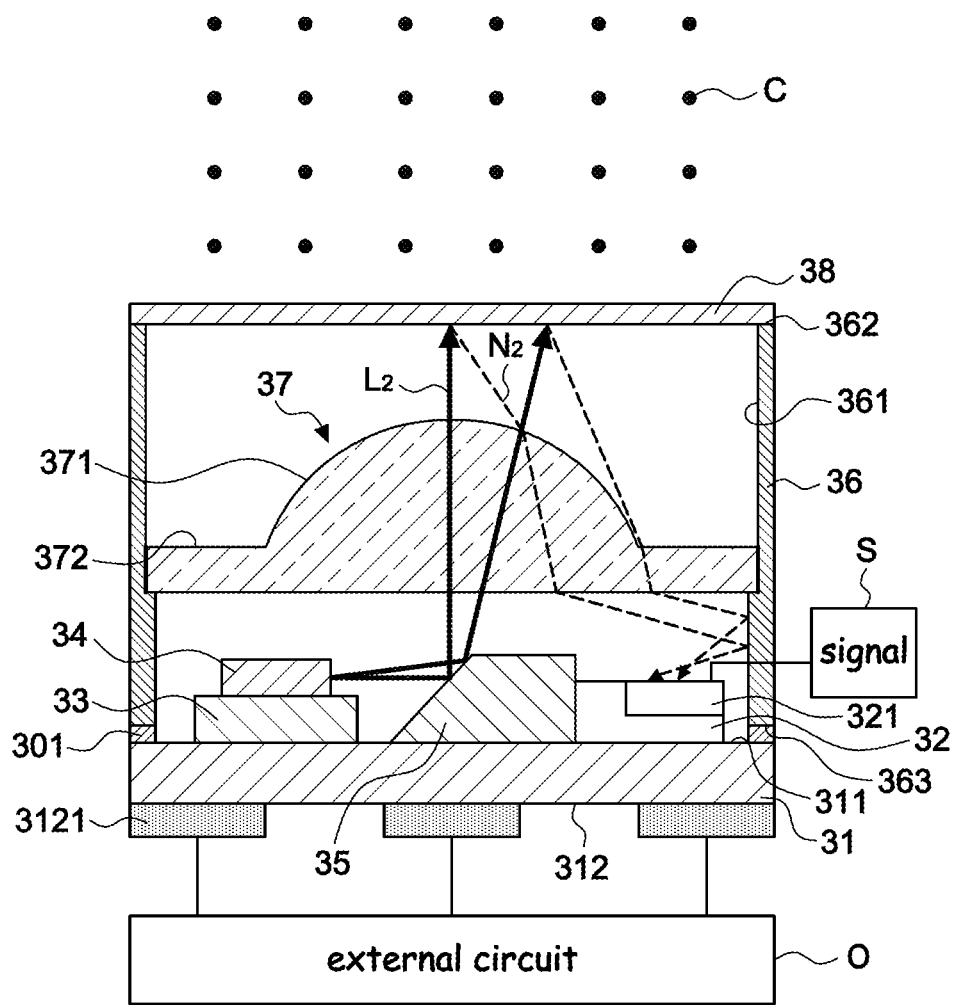
FIG. 3C is a sectional view along line 3C-3C of FIG. 3B.
Figure 5:
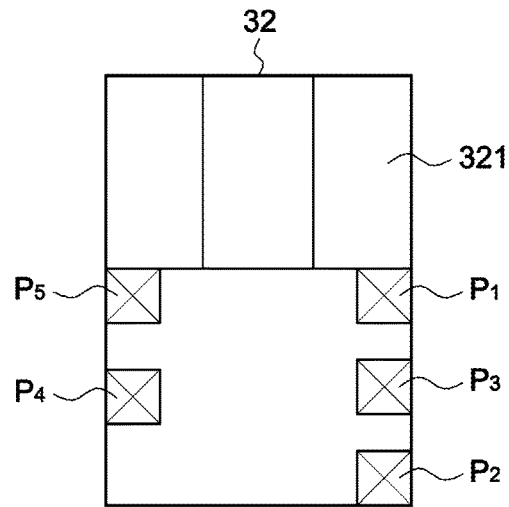
FIG. 5 is a top plan view of an automatic power control integrated circuit (IC) of the present invention.
Figure 6:
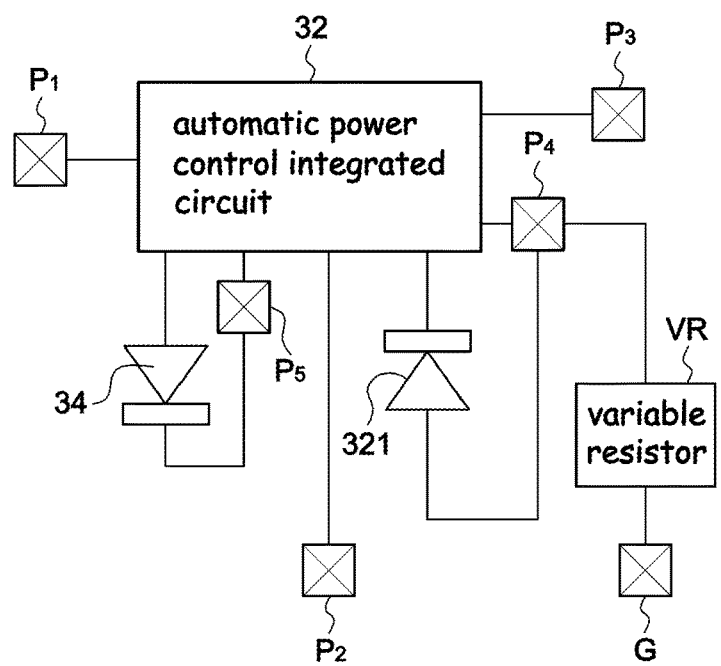
FIG. 6 is a circuit diagram of the automatic power control IC of the present invention.
Figure 7:
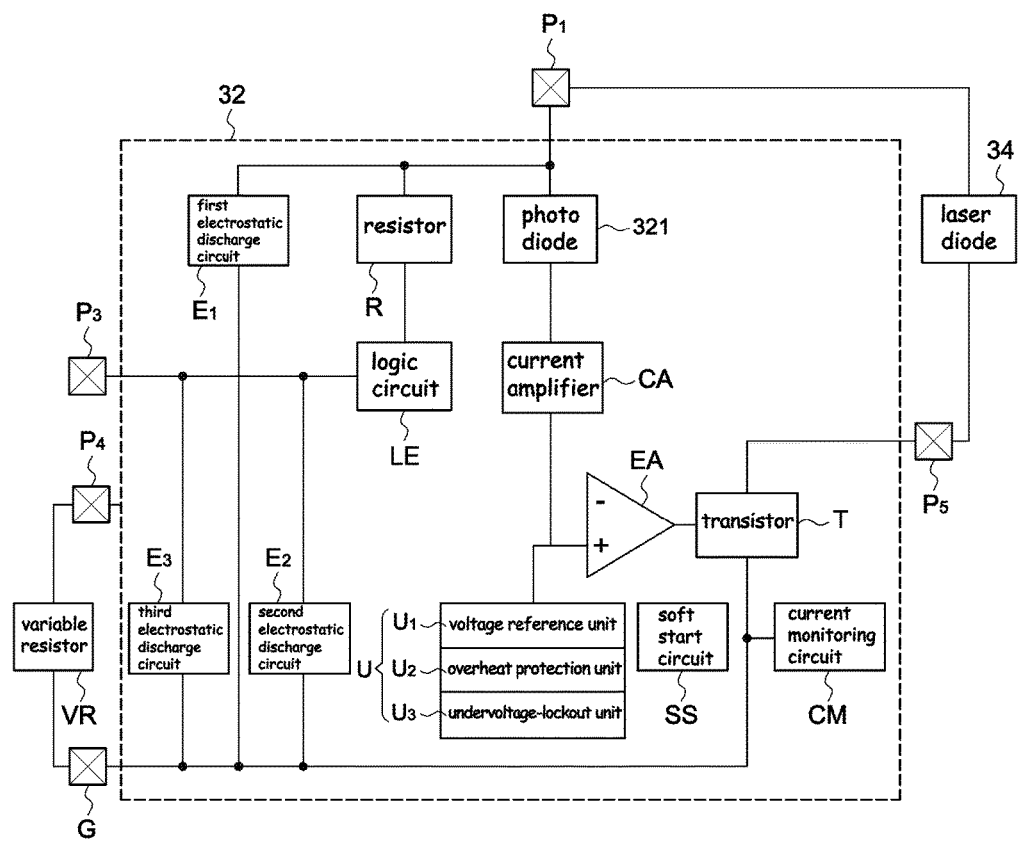
FIG. 7 is a schematic diagram illustrating a circuit structure of the automatic power control IC of the present invention.

Referring to FIGS. 3A-3C and 5-7, in a preferred embodiment, a dot projector with automatic power control 30A mainly includes a substrate 31, an automatic power control integrated circuit (IC) 32, a mounting seat 33, a laser diode 34, a reflector 35, a housing 36, a collimator 37 and a diffractive optical element (DOE) 38.

The substrate 31 includes a first surface 311 with a first conductive pad 3111 and a second surface 312 with a second conductive pad 3121 in this embodiment. The first and second surfaces 311, 312 are arranged at opposite sides correspondingly and the substrate 31 is made of a printed circuit board for an internal wire to be coupled with the first and second conductive pads 3111, 3121; the second conductive pad 3121 is connected to an external circuit O, but the present invention is not limited to such application.

The automatic power control IC 32 is mounted on the substrate 31 and includes a photodiode 321 connected to the automatic power control IC 32 via the first conductive pad 3111. In this embodiment, the automatic power control IC 32 includes a voltage input pin $P_1$, a ground pin $P_2$, a current setting pin $P_3$, a photodiode output pin $P_4$ and a laser diode output pin $P_5$, but it is not limited to such application.

The mounting seat 33 is mounted on the substrate 31; the laser diode 34 is mounted on the mounting seat 33 and coupled to the automatic power control 32. In this embodiment, the first conductive pad 3111 is connected to the automatic power control IC 32 and the laser diode 34 with a plurality of external wires W, but the present invention is not limited to such application.

The reflector 35 is mounted at a front of the laser diode 34. The housing 36 has an installing space 361 and a platform 362 and covers on the substrate 31 for the automatic power control IC 32, the laser diode 34 and the reflector 35 to be covered within the installing space 361 of the housing 36. In the embodiment, the housing 36 is made of copper, stainless steel or aluminum, but it is not limited to such application.

Furthermore, the first surface 311 of the substrate 31 has a metal frame 3112 framing the automatic power control IC 32, the mounting seat 33 and the reflector 35. The metal frame 3112 has a bonding layer 301 thereon bonded with a bottom surface 363 of the housing 36. In this embodiment, the bonding layer 301 is made of either adhesives or metal; the adhesive is either silicone or epoxy and the metal is selected from a group consisting of gold-tin, copper-silver, tin-silver-copper and indium. But the present invention is not limited to such application.

The collimator 37 is disposed in the installing space 361 of the housing 36 above the automatic power control IC 32, the laser diode 34 and the reflector 35. In this embodiment, the collimator 37 is either a single lens or an array of microlenses. And the DOE 38 is adhered on the platform 362 of the housing 36 for the DOE 38 to be above the collimator 37.

Figure 4A:
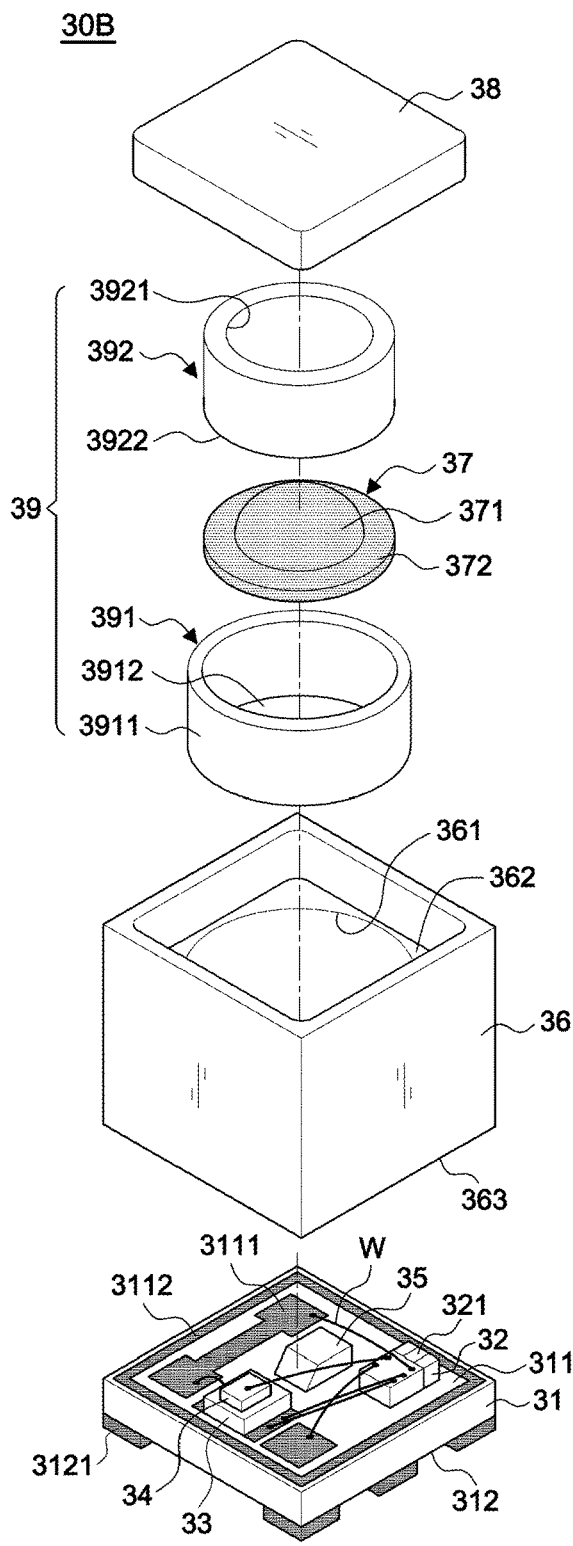
FIG. 4A is an exploded view of the present invention in another embodiment.
Figure 4B:
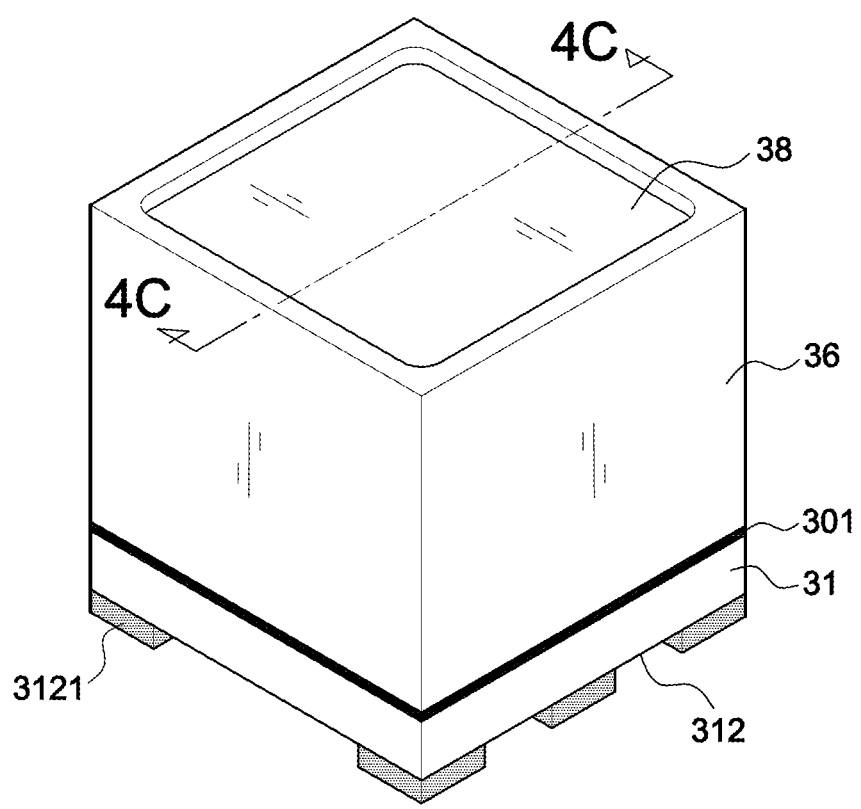
FIG. 4B is a perspective view of the present invention in another embodiment.
Figure 4C:
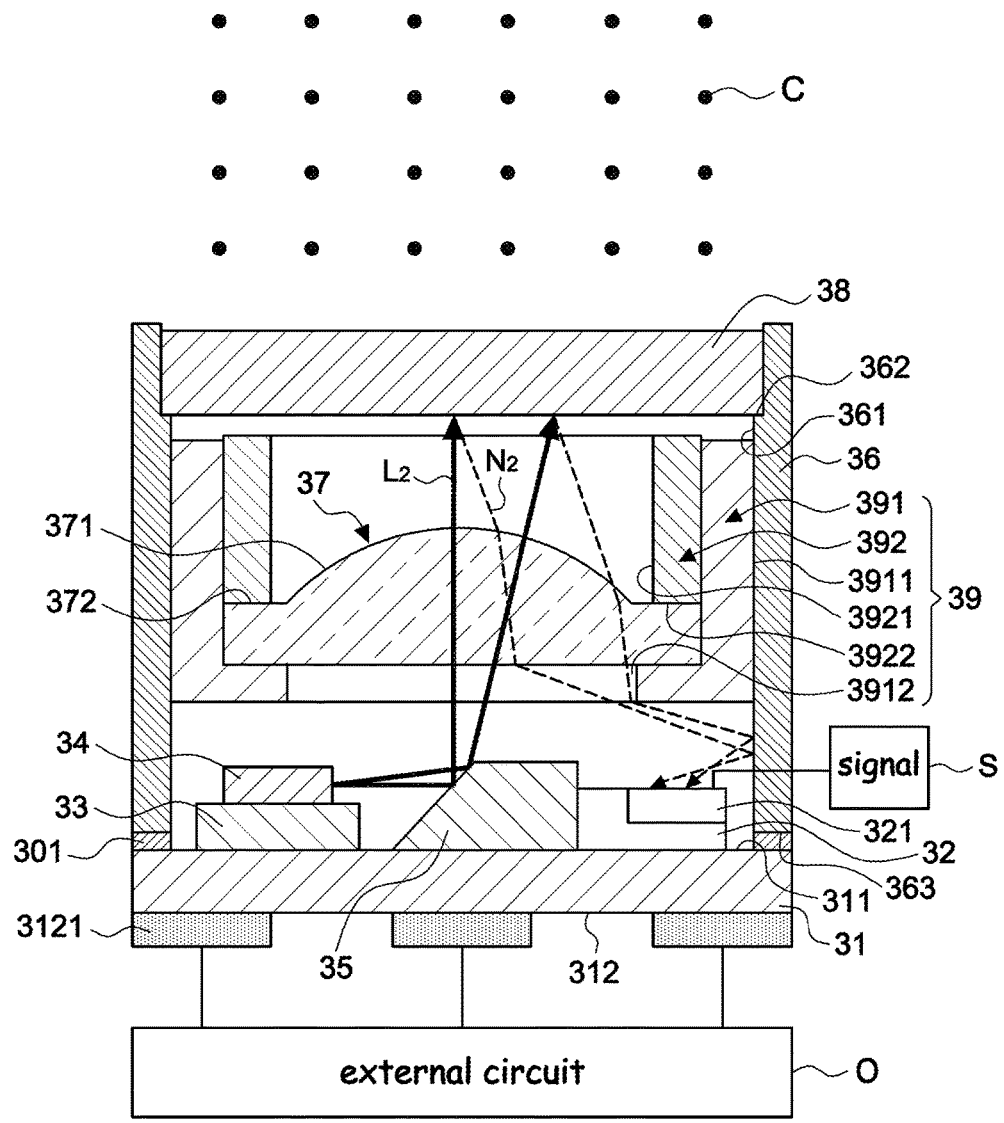
FIG. 4C is a sectional view along line 4C-4C of FIG. 4B.

Another preferred embodiment of the present invention is further illustrated in FIGS. 4A-7. A dot projector with automatic power control 30B in this embodiment mainly includes a substrate 31, an automatic power control integrated circuit (IC) 32, a mounting seat 33, a laser diode 34, a reflector 35, a housing 36, a collimator 37 and a diffractive optical element (DOE) 38 with the same structure as in the previous embodiment. A fixing structure 39 is further disposed in the installing space 361 of the housing 36. The fixing structure 39 includes an outer ring 391 and an inner ring 392. The outer ring 391 has an outer periphery 3911 fixedly abutting the installing space 361 for the collimator 37 to be disposed therein and including a central hole 3912 corresponding to a central protrusion 371 of the collimator 37 and aligning with the reflector 35 perpendicularly. The inner ring 392 has an inner periphery 3921 mounted on the central protrusion 371 of the collimator 37 and a bottom surface 3922 abutting on a flat surface 372 of the collimator 37. The platforms 362 of the housing 36 is arranged within the housing 36 to form a rabbet, but it is not limited to such application.

According to the embodiments, either the platform 362 is arranged higher or lower within the housing or whether the fixing structure 39 is included or not, the present invention has the laser diode 34 emits a laser light $L_2$ to the reflector 35 and the laser light $L_2$ is reflected perpendicularly through the collimator 37 to the DOE 38; the DOE 38 thereby produces a plurality of light spots C and the laser light $L_2$ produces a stray light $N_2$ by reflection within the housing 36. The photodiode 321 of the automatic power control IC 32 then detects the stray light $N_2$ and sends a feedback signal S to the laser diode 34 for the laser diode 34 to adjust emission power of the laser light $L_2$ and further control the light spots C from the DOE 38.

A structure of the automatic power control IC 32 further includes having the voltage input pin $P_1$ series connected to the photodiode 321 and parallel connected to a resistor R and a first electrostatic discharge (ESD) circuit $E_1$ that is parallel connected to a ground pin G, a logic circuit LE separately connected to the resistor R and the current setting pin $P_3$ in series connection, a current amplifier CA series connected to the photodiode 321, an error amplifier EA parallel connected to the current amplifier CA, a protection circuit U parallel connected to the error amplifier EA and including a voltage reference unit $U_1$, an overheat protection unit $U_2$ and an undervoltage-lockout unit $U_3$, a transistor T separately connected to the error amplifier EA, the laser diode output pin $P_5$ and the ground pin G in series connection, a current monitoring circuit CM parallel connected to the ground pin G, a second ESD circuit $E_2$ separately connected to the current setting pin CM and the ground pin G in parallel connection, a third ESD circuit $E_3$ separately connected to the current setting pin CM and the ground pin G in parallel connection, a variable resistor VR separately connected to the photodiode output pin $P_4$ and the ground pin G in series connection; the laser diode 34 is separately connected to the voltage input pin $P_1$ and the laser diode output pin $P_5$ in series connection, and a soft start circuit SS for preventing overcurrent during activation of the device.

In this embodiment, a voltage value of the voltage input pin $P_1$ is 2.8V. The voltage reference unit $U_1$ is set for a voltage value of 0.55V when the logic circuit LE distinguishes the current setting pin $P_3$ is logical high, and the voltage reference unit $U_1$ is set for a voltage value of 1.1V when the logic circuit LE distinguishes the current setting pin $P_3$ is logical low; the overheat protection unit $U_2$ is set for a temperature higher than 165° and less than 135°; and the undervoltage-lockout unit $U_3$ is set for a voltage value less than 2.3V and greater than 2.5V. The current monitoring circuit CM is set for a current value of 100 mA when the logic circuit LE distinguishes the current setting pin $P_3$ is logical high, and the current monitoring circuit CM is set for a current value of 300 mA when the logic circuit LE distinguishes the current setting pin $P_3$ is logical low. A value of a human body model of the first, second and third ESD circuits $E_1$, $E_2$, $E_3$ is set greater or equal to 2 KV and a machine model of the first, second and third ESD circuits $E_1$, $E_2$, $E_3$ is set greater or equal to 200V. The variable resistor VR is set for a value ranging 35 Kohm-1 Kohm; furthermore, it is set for 6 Kohm when the photodiode 321 is set for a current value of 90 uA. However, the present invention is not limited to such application.

Based on the structures disclosed, the substrate 31 integrates the automatic power control IC 32 of the photodiode 321, the mounting seat 33, the laser diode 34, the reflector 35, the housing 36, the collimator 37 and the DOE 38, and the laser diode 34, the automatic power control IC 32 and the reflector 35 further forms a feedback control structure of the laser light $L_2$.

Also, the automatic power control IC 32 has temperature compensation structure to stabilize output of the laser light $L_2$ and has functions of over current protection, overheat protection and transient protection, making the present invention an easy assembly with light weight and low prime costs. The output power of the laser light $L_2$ is also well controlled for further control of the light spots C emitted from the DOE 38 for stable output.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A dot projector with automatic power control, comprising:
    a substrate;
    an automatic power control integrated circuit mounted on said substrate and including a photodiode;
    a mounting seat mounted on said substrate;
    a laser diode mounted on said mounting seat and coupled to said automatic power control integrated circuit;
    a reflector mounted at a front of said laser diode;
    a housing having an installing space and a platform and covering on said substrate for said automatic power control integrated circuit, said laser diode and said reflector to be covered within said installing space of said housing;
    a collimator disposed in said installing space of said housing above said automatic power control integrated circuit, said laser diode and said reflector; and
    a diffractive optical element adhered on said platform of said housing for said diffractive optical element to be above said collimator;
    whereby the laser diode emits a laser light to the reflector and the laser light is reflected perpendicularly through the collimator to the diffractive optical element, the diffractive optical element thereby producing a plurality of light spots and the laser light producing a stray light by the reflection; the photodiode of the automatic power control integrated circuit then detects the stray light and sends a feedback signal to the laser diode for the laser diode to adjust emission power of the laser light and further control the light spots from the diffractive optical element.

2. The dot projector with automatic power control as claimed in claim 1, wherein the automatic power control integrated circuit includes a voltage input pin, a ground pin, a current setting pin, a photodiode output pin and a laser diode output pin.

3. The dot projector with automatic power control as claimed in claim 2, wherein a structure of the automatic power control integrated circuit further includes having the voltage input pin series connected to the photodiode and parallel connected to a resistor and a first electrostatic discharge circuit, said first electrostatic discharge circuit further parallel connected to a ground pin, a logic circuit separately connected to the resistor and the current setting pin in series connection, a current amplifier series connected to the photodiode, an error amplifier parallel connected to the current amplifier, a protection circuit parallel connected to the error amplifier and including a voltage reference unit, an overheat protection unit and an undervoltage-lockout unit, a transistor separately connected to the error amplifier, the laser diode output pin and the ground pin in series connection, a current monitoring circuit parallel connected to the ground pin, a second electrostatic discharge circuit separately connected to the current setting pin and the ground pin in parallel connection, a third electrostatic discharge circuit separately connected to the current setting pin and the ground pin in parallel connection and a variable resistor separately connected to the photodiode output pin and the ground pin in series connection, said laser diode separately connected to said voltage input pin and said laser diode output pin in series connection.

4. The dot projector with automatic power control as claimed in claim 2, wherein the automatic power control integrated circuit further includes a soft start circuit for preventing overcurrent during activation of the dot projector.

5. The dot projector with automatic power control as claimed in claim 3, wherein the current monitoring circuit is set for a current value of 100 mA when the logic circuit distinguishes the current setting pin is logical high, and the current monitoring circuit is set for a current value of 300 mA when the logic circuit distinguishes the current setting pin is logical low.

6. The dot projector with automatic power control as claimed in claim 3, wherein the voltage reference unit is set for a voltage value of 0.55V when the logic circuit distinguishes the current setting pin is logical high, and the voltage reference unit is set for a voltage value of 1.1V when the logic circuit distinguishes the current setting pin is logical low; the overheat protection unit is set for a temperature higher than 165° and less than 135°; and the undervoltage-lockout unit is set for a voltage value less than 2.3V and greater than 2.5V.

7. The dot projector with automatic power control as claimed in claim 3, wherein the variable resistor is set for a value ranging 35 Kohm-1 Kohm.

8. The dot projector with automatic power control as claimed in claim 7, wherein when the photodiode is set for a current value of 90 uA, the variable resistor is set for a value of 6 Kohm correspondingly.

9. The dot projector with automatic power control as claimed in claim 3, wherein a value of a human body model of the first, second and third electrostatic discharge circuits is set greater or equal to 2 KV and a machine model of the first, second and third electrostatic discharge circuits is set greater or equal to 200V.

10. The dot projector with automatic power control as claimed in claim 1, wherein the substrate includes a first surface with a first conductive pad and a second surface with a second conductive pad, said first and second surfaces are arranged at opposite sides correspondingly, and the substrate is made of a printed circuit board for an internal wire to be coupled with the first and second conductive pads, said first conductive pad connected to said automatic power control integrated circuit and said laser diode with a plurality of external wires and said second conductive pad connected to an external circuit.

11. The dot projector with automatic power control as claimed in claim 1, wherein the collimator is either a single lens or an array of microlenses.

12. The dot projector with automatic power control as claimed in claim 1, wherein the housing is made of copper, stainless steel or aluminum.

13. The dot projector with automatic power control as claimed in claim 1, wherein the first surface of the substrate has a metal frame framing the automatic power control integrated circuit, the mounting seat and the reflector, and the metal frame has a bonding layer thereon bonded with a bottom surface of the housing.

14. The dot projector with automatic power control as claimed in claim 13, wherein the metal frame is made of either nickel gold or nickel palladium gold.

15. The dot projector with automatic power control as claimed in claim 13, wherein the bonding layer is made of either adhesives or metal.

16. The dot projector with automatic power control as claimed in claim 15, wherein the adhesives is either silicone or epoxy.

17. The dot projector with automatic power control as claimed in claim 15, wherein the metal is selected from a group consisting of gold-tin, copper-silver, tin-silver-copper and indium.

18. The dot projector with automatic power control as claimed in claim 1, wherein the installing space of the housing further has a fixing structure therein, including an outer ring and an inner ring, said outer ring having an outer periphery thereof fixedly abutting the installing space for the collimator to be disposed therein and including a central hole corresponding to a central protrusion of the collimator and aligning with the reflector perpendicularly, said inner ring having an inner periphery thereof mounted on the central protrusion of the collimator and a bottom surface thereof abutting on a flat surface of the collimator.

19. The dot projector with automatic power control as claimed in claim 1, wherein the platform of the housing is arranged within the housing to form a rabbet.

\* \* \* \* \*